United States Patent
Choi et al.

(10) Patent No.: US 10,416,317 B2
(45) Date of Patent: Sep. 17, 2019

(54) VEHICLE AND MAP GENERATING METHOD FOR THE VEHICLE

(71) Applicant: Hyundai Motor Company, Seoul (KR)

(72) Inventors: Taesung Choi, Gyeongsangnam-do (KR); Jihyun Yoon, Seoul (KR)

(73) Assignee: Hyundai Motor Company, Seoul (KR)

( * ) Notice: Subject to any disclaimer, the term of this patent is extended or adjusted under 35 U.S.C. 154(b) by 430 days.

(21) Appl. No.: 14/955,080

(22) Filed: Dec. 1, 2015

(65) Prior Publication Data

US 2017/0059716 A1  Mar. 2, 2017

(30) Foreign Application Priority Data

Sep. 2, 2015 (KR) .......................... 10-2015-0123936

(51) Int. Cl.
| | |
|---|---|
| G01S 19/42 | (2010.01) |
| G06F 17/50 | (2006.01) |
| G06F 17/12 | (2006.01) |
| G01C 21/00 | (2006.01) |
| G01S 19/39 | (2010.01) |

(52) U.S. Cl.
CPC .............. *G01S 19/42* (2013.01); *G01C 21/00* (2013.01); *G01S 19/39* (2013.01); *G06F 17/12* (2013.01); *G06F 17/50* (2013.01)

(58) Field of Classification Search
CPC ....................................................... G06F 17/50
USPC ............................................................. 703/1
See application file for complete search history.

(56) References Cited

U.S. PATENT DOCUMENTS

| | | | | |
|---|---|---|---|---|
| 2009/0070035 A1* | 3/2009 | Van Buer | ............... | G01C 21/32 701/450 |
| 2012/0101718 A1* | 4/2012 | Lee | ......... | G01C 21/30 701/409 |
| 2012/0277993 A1 | 11/2012 | Mund | | |
| 2013/0021382 A1* | 1/2013 | Morlock | ............... | G01C 21/32 345/672 |
| 2013/0238235 A1* | 9/2013 | Kitchel | ................. | G01C 21/32 701/412 |

FOREIGN PATENT DOCUMENTS

| | | |
|---|---|---|
| JP | 2010-197278 A | 9/2010 |
| JP | 4884109 B2 | 2/2012 |
| JP | 2013-061320 A | 4/2013 |
| KR | 10-0496814 | 6/2005 |
| KR | 10-1206570 B1 | 8/2011 |

OTHER PUBLICATIONS

Stewart Worrall, Automated Process for Generating Digitised Maps through GPS Data Compression. (Year: 2007).*

* cited by examiner

*Primary Examiner* — Lechi Truong
(74) *Attorney, Agent, or Firm* — Mintz Levin Cohn Ferris Glovsky and Popeo, P.C.; Peter F. Corless

(57) ABSTRACT

A map generating method includes: modeling a predetermined amount of global positioning system (GPS) data as linear segments; determining whether a difference between the modeled segments and the GPS data is within a predetermined range; and determining an amount of GPS data forming the modeled segments based on whether the difference is within the predetermined range.

20 Claims, 6 Drawing Sheets

VEHICLE AND MAP GENERATING METHOD FOR THE VEHICLE

CROSS-REFERENCE TO RELATED APPLICATION

This application claims the benefit of and priority to Korean Patent Application No. 10-2015-0123936, filed on Sep. 2, 2015 in the Korean Intellectual Property Office, the disclosure of which being incorporated herein in its entirety by reference.

BACKGROUND

1. Technical Field

The present disclosure relates generally to vehicular technologies and, more particularly, to a method of generating a map by dividing road shape information formed of GPS data into a plurality of segments and modeling each of the segments.

2. Description of the Related Art

As technologies related to autonomous vehicular travel are developed, research on precise maps including road shape information, and the like, which are more precise than existing map information, is being conducted. However, due to a vast amount of global positioning system (GPS) coordinate values which indicate precise map information, there can be a limitation in storing the precise map information as the GPS coordinate values.

SUMMARY

Embodiments disclosed herein provide a method of generating a map by dividing road shape information formed of GPS data into a plurality of segments and modeling each of the segments, and a vehicle including the map generated as above.

According embodiments of the present disclosure, a map generating method includes: modeling a predetermined amount of global positioning system (GPS) data as linear segments; determining whether a difference between the modeled segments and the GPS data is within a predetermined range; and determining an amount of GPS data forming the modeled segments based on whether the difference is within the predetermined range.

The determining of the amount of GPS data forming the segments may include decreasing the amount of GPS data by a predetermined percentage when the difference deviates from the predetermined range.

The map generating method may further include remodeling the decreased amount of GPS data as linear segments, determining whether the decreased amount of GPS data corresponds to the predetermined amount when a difference between the remodeled segments and the decreased amount of GPS data deviates from the predetermined range, and storing the remodeled segments when the decreased amount of GPS data corresponds to the predetermined amount.

The map generating method may further include decreasing further the decreased amount of GPS data by the predetermined percentage when the decreased amount of GPS data does not correspond to the predetermined amount.

The map generating method may further include storing the remodeled segments when the difference between the remodeled segments and the decreased amount of GPS data is within the predetermined range, increasing the decreased amount of GPS data by a predetermined percentage, and remodeling the increased amount of GPS data as linear segments.

The determining of the amount of GPS data forming the modeled segments may include increasing the amount of GPS data by the predetermined percentage when the difference is within the predetermined range.

The map generating method may further include remodeling the increased amount GPS data as linear segments, further increasing the increased amount of GPS data by the predetermined percentage when the difference between the remodeled segments and the increased amount of GPS data is within the predetermined range, and modeling again the further increased amount of GPS data as linear segments.

The map generating method may further include determining whether the increased amount of GPS data corresponds to the predetermined amount when the difference between the remodeled segments and the increased amount of GPS data deviates from the predetermined range, and decreasing the increased amount of GPS data by the predetermined percentage when the increased amount of GPS data does not correspond to the predetermined amount.

The map generating method may further include storing the remodeled segments when the increased amount of GPS data corresponds to the predetermined amount.

In addition, the map generating method may further include determining whether an end point of an $n^{th}$ (n is a natural number equal to or greater than 1) segment and a start point of an $(n+1)^{th}$ segment among the segments correspond to each other, and making the end point of the $n^{th}$ segment correspond to the start point of the $(n+1)^{th}$ segment when the end point of the $n^{th}$ segment and the start point of the $(n+1)^{th}$ segment do not correspond to each other.

The making of the end point of the $n^{th}$ segment correspond to the start point of the $(n+1)^{th}$ segment may include making the start point and the end point of the segments correspond to respectively corresponding GPS data, and making differential values of the end point of the $n^{th}$ segment and the start point of the $(n+1)^{th}$ segment correspond to each other.

The map generating method may further include inserting a Hermite curve at the corresponding point.

Furthermore, according to embodiments of the present disclosure, a vehicle includes: a GPS device for generating GPS data, and a processor configured to receive the GPS data from the GPS device, model a predetermined amount of GPS data as linear segments, and determine an amount of GPS data forming the modeled segments based on whether a difference between the modeled segments and the GPS data is within a predetermined range.

When the difference deviates from the predetermined range, the processor may decrease the amount of GPS data by a predetermined percentage.

The processor may be further configured to remodel the decreased amount of GPS data as linear segments, determine whether the decreased amount of GPS data corresponds to a predetermined amount when a difference between the remodeled segments and the decreased amount of GPS data deviates from the predetermined range, and store the remodeled segments when the decreased amount of GPS data corresponds to the predetermined amount.

The processor may further decrease the decreased amount of GPS data by the predetermined percentage again when the decreased amount of GPS data does not correspond the predetermined number.

When the difference between the remodeled segments and the decreased amount GPS data is within the predetermined range, the processor may be further configured to store the remodeled segments, increase the decreased amount of GPS data by a predetermined percentage, and remodel the increased amount of GPS data as linear segments.

When the difference is within the predetermined range, the processor may be further configured to increase the amount of GPS data by the predetermined percentage.

The processor may be further configured to remodel the increased amount of GPS data as linear segments, further increase the amount of increased amount GPS data by the predetermined percentage when the difference between the remodeled segments and the increased amount GPS data is within the predetermined range, and model again the further increased amount of GPS data as linear segments.

The processor may be further configured to determine whether the increased amount of GPS data corresponds to the predetermined amount when the difference between the remodeled segments and the increased amount of GPS data deviates from the predetermined range, and decrease the increased amount of GPS data by the predetermined percentage when the increased amount of GPS data does not correspond to the predetermined amount.

The processor may be further configured to store the remodeled segments when the increased amount of GPS data corresponds to the predetermined amount.

The processor may be further configured to determine whether an end point of an $n^{th}$ (n is a natural number equal to or greater than 1) segment and a start point of an $(n+1)^{th}$ segment among the plurality of segments correspond to each other; and make the end point of the $n^{th}$ segment correspond to the start point of the $(n+1)^{th}$ segment when the end point of the $n^{th}$ segment and the start point of the $(n+1)^{th}$ segment do not correspond to each other.

The processor may when the end point of the $n^{th}$ segment and the start point of the $(n+1)^{th}$ segment do not correspond to each other make the start point and the end point of the segments correspond to respectively corresponding GPS data, and make differential values of the end point of the $n^{th}$ segment and the start point of the $(n+1)^{th}$ segment correspond to each other.

The processor may be further configured to a Hermite curve at a corresponding point of the start point and the end point of the segments.

BRIEF DESCRIPTION OF THE DRAWINGS

These and/or other aspects of the present disclosure will become apparent and more readily appreciated from the following description of the embodiments, taken in conjunction with the accompanying drawings of which.

DETAILED DESCRIPTION OF THE EMBODIMENTS

Hereinafter, embodiments of the present disclosure will be described in detail with reference to the accompanying drawings. As those skilled in the art would realize, the described embodiments may be modified in various different ways, all without departing from the spirit or scope of the present disclosure. Further, throughout the specification, like reference numerals refer to like elements.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one processor. A memory may configured to store program instructions, and the processor may be specifically programmed to execute the program instructions to perform one or more processes which are described further below. Moreover, it is understood that the below methods may be executed by an apparatus comprising the processor in conjunction with one or more other components, as would be appreciated by a person of ordinary skill in the art.

Hereinafter, embodiments related to a vehicle and a map generating method for the vehicle according to an aspect of the present disclosure will be described in detail with reference to the accompanying drawings.

Figure 1:
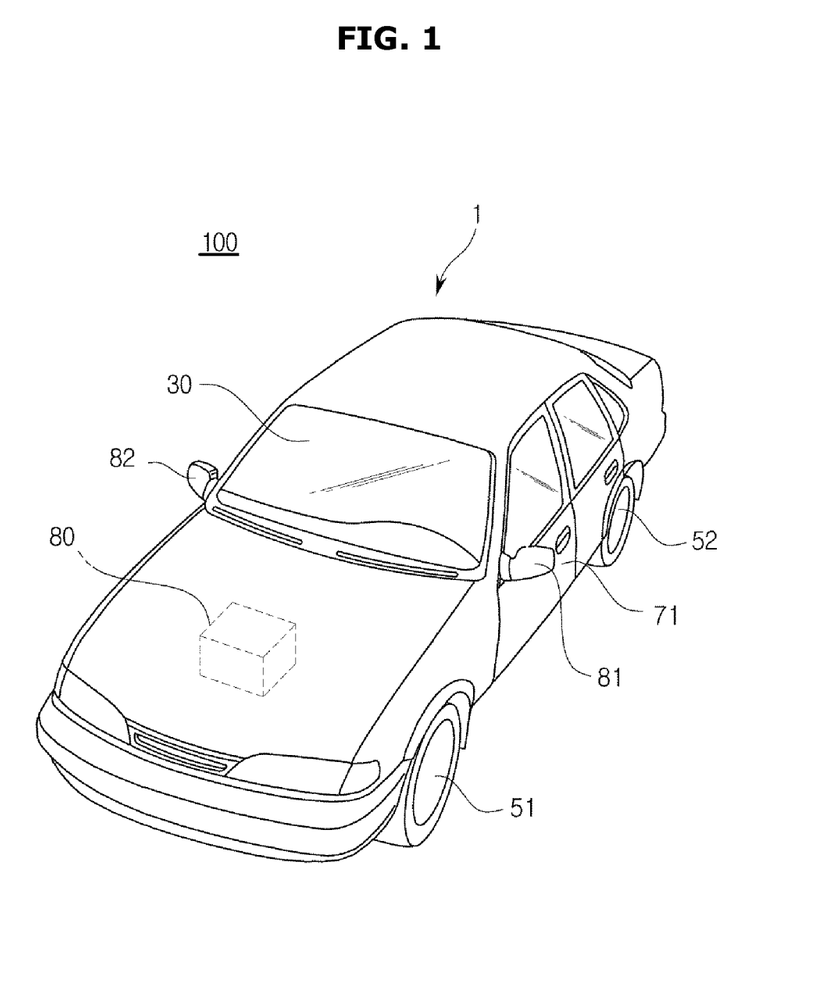
FIG. 1 is an exterior view of a vehicle according to embodiments of the present disclosure.
Figure 2:
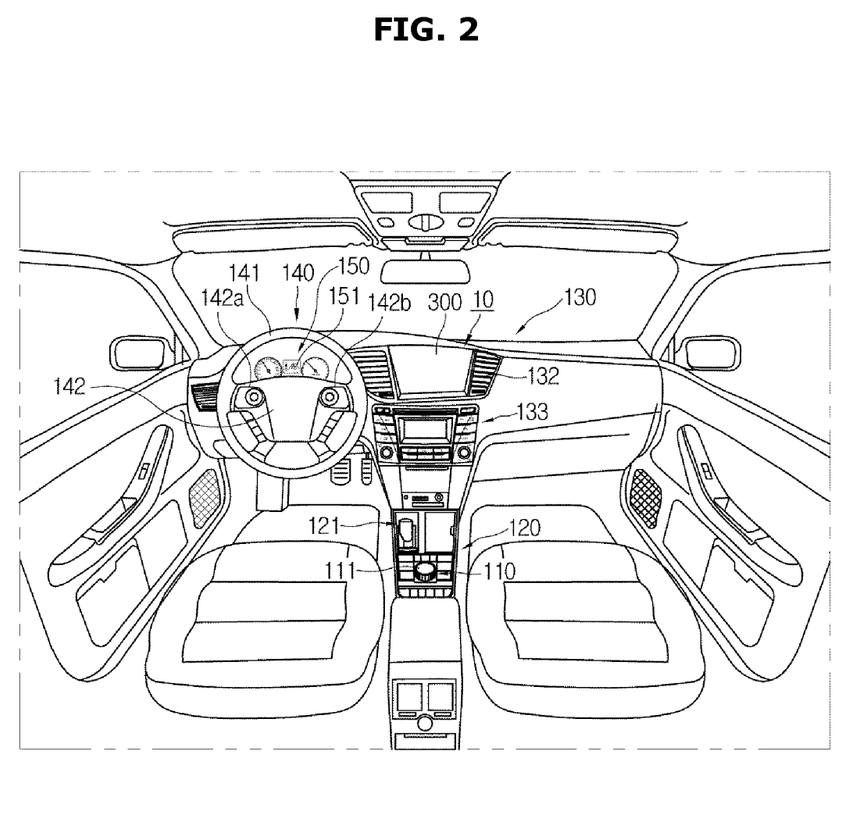
FIG. 2 is a view illustrating an inner configuration of the vehicle according to embodiments.

FIG. 1 is an exterior view of a vehicle according to embodiments, and FIG. 2 is a view illustrating an inner configuration of the vehicle according to embodiments.

As shown in FIG. 1, a vehicle 100 according to embodiments of the present disclosure includes a main body 1 forming an exterior of the vehicle 100, wheels 51 and 52 moving the vehicle 100, a driving device 80 rotating the wheels 51 and 52, doors 71 covering an inner portion of the vehicle 100 from the outside, a front glass 30 providing a view in front of the vehicle 100 to a driver in the vehicle 100, and side mirrors 81 and 82 providing a view behind the vehicle 100 to the driver.

The wheels 51 and 52 include front wheels 51 provided at a front portion of the vehicle 100, and rear wheels 52 provided at a rear portion of the vehicle 100.

The driving device 80 provides a rotary force to the front wheels 51 or rear wheels 52 to move the main body 1 forward or backward. The driving device 80 may include an engine which generates a rotary force by burning fossil fuel, or a motor which generates a rotary force by receiving a power source from a condenser (not shown).

The doors 71 are rotatably provided at left and right sides of the main body 1 to enable the driver to get into the vehicle 100 when opened, and cover the inner portion of the vehicle 100 from the outside when closed.

The front glass 30, which is called "windshield glass," is provided at an upper front portion of the main body 1. The driver in the vehicle 100 may view the front of the vehicle 100 through the front glass 30. In addition, the side mirrors 81 and 82 include a left side mirror 81 provided at a left side of the main body 1, and a right side mirror 82 provided at a right side of the main body 1. The driver in the vehicle 100 may check situations at the side and rear of the vehicle 100 with his or her eyes through the side mirrors 81 and 82.

In addition, the vehicle 100 may include various sensors such as an image sensor or a distance sensor which detect obstacles near the vehicle 100 to assist the driver in recognizing situations near the vehicle 100. In addition, the vehicle 100 may include various sensors such as a velocity sensor or an acceleration sensor which are able to detect travel information of a vehicle such as a velocity of the vehicle. Referring to FIG. 2, the vehicle 100 may include a gearbox 120 and a dashboard at which a center fascia 130 (i.e., center console), a steering wheel 140, and a dashboard 150 etc. are provided.

A gear lever 121 for vehicle transmission may be installed at the gearbox 120. In addition, as shown in FIG. 2, a dial manipulation unit 111 provided to enable a user to control a performance of a function of a multimedia device including navigation 10 or an audio device 133, etc., or a main function of the vehicle 100, and an input unit 110 which includes various buttons may be installed at the gearbox.

An air conditioning device 132, the audio device 133, and the navigation 10, etc. may be installed at the center fascia 130.

The air conditioning device adjusts a temperature, humidity, air quality, and air flow in the vehicle 100 to comfortably maintain the inner portion of the vehicle 100. The air conditioning device may include at least one outlet installed at the center fascia 130 to discharge air. A button or dial, etc. for controlling the air conditioning device, etc. may be installed at the center fascia 130. A user such as a driver may use the button or dial disposed at the center fascia 130 to control the air conditioning device in the vehicle 100. The user such as the driver may also control the air conditioning device through the buttons of the input unit 110 or the dial manipulation unit 111 which are installed at the gearbox 120.

According to embodiments, the navigation 10 may be installed at the center fascia 130. The navigation 10 may be embedded in the center fascia 130. According to embodiments, the input unit for controlling the navigation 10 may be installed at the center fascia 130. According to embodiments, the input unit for the navigation 10 may be installed at a position other than the center fascia 130. For example, the input unit for the navigation 10 may be formed near a display 300 of the navigation 10. In addition, as another example, the input unit for the navigation 10 may be installed at the gearbox 120, etc. In addition, the navigation 10 may include a GPS device 11 and receive GPS information. The GPS device 11 may be included in the aforementioned navigation 10 to be integrally provided with the navigation 10, or separately provided from the navigation 10.

The steering wheel 140 is a device for adjusting a travel direction of the vehicle 100, and may include a rim 141 gripped by a driver, and a spoke 142 connected to a steering device of the vehicle 100 and connecting the rim 141 to a hub of a rotary shaft for steering. According to embodiments, manipulation devices 142a and 142b for controlling various types of devices, e.g. an audio device, etc. in the vehicle 100 may be provided at the spoke 142. In addition, various types of dashboards 150 capable of displaying a travel speed, engine RPM, or residual fuel, etc. of the vehicle 100 may be installed at the dashboard. Each of the various types of dashboards 150 may include a dashboard display 151 which displays a vehicle condition, information related to vehicle traveling, information related to manipulating the multimedia device, etc. The driver may manipulate the various devices mentioned above which are provided at the dashboard to drive the vehicle 100. Various sensors capable of detecting information outside the vehicle 100 which is required for traveling the vehicle 100 or travel information of the vehicle 100 itself may be provided at the vehicle 100 besides the devices shown in FIG. 2 which may be manipulated by the driver for driving the vehicle 100.

Figure 3:
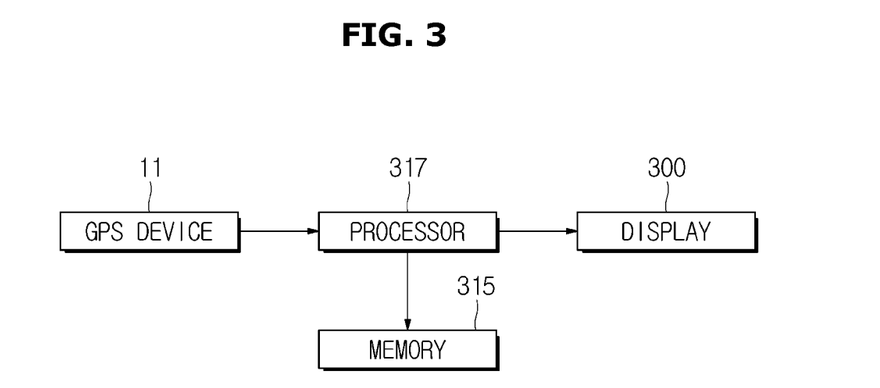
FIG. 3 is a control block diagram of the vehicle according to embodiments.

The vehicle according to a disclosed embodiments may perform autonomous traveling without driver intervention based on information detected in the various sensors, generate a precise map required for the autonomous traveling, or store a pre-generated precise map in a memory 315. Hereinafter, a method of generating a precise map according to the disclosed embodiments will be described in detail with reference to FIGS. 3 to 5. FIG. 3 is a control block diagram of the vehicle according to embodiments, and FIGS. 4 and 5 are views conceptually illustrating a method of modeling GPS data according to embodiments.

As shown in FIG. 3, the vehicle according to a disclosed embodiments may include the GPS device 11 for receiving GPS information, a processor 317 for receiving GPS data generated in the GPS device 11 to generate a precise map in which road shape information is included, the memory 315 for storing the precise map generated in the processor 317, and the display 300 for displaying the precise map.

Figure 4:
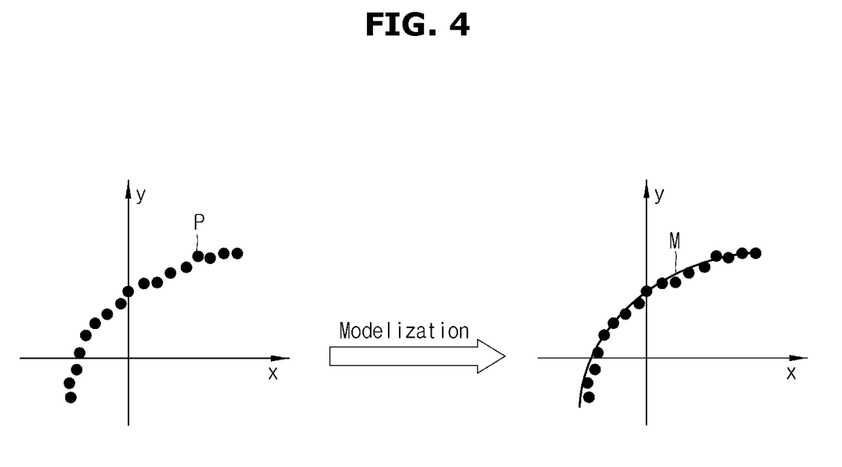
FIGS. 4 and 5 are views conceptually illustrating a method of modeling GPS data according to embodiments.
Figure 5:
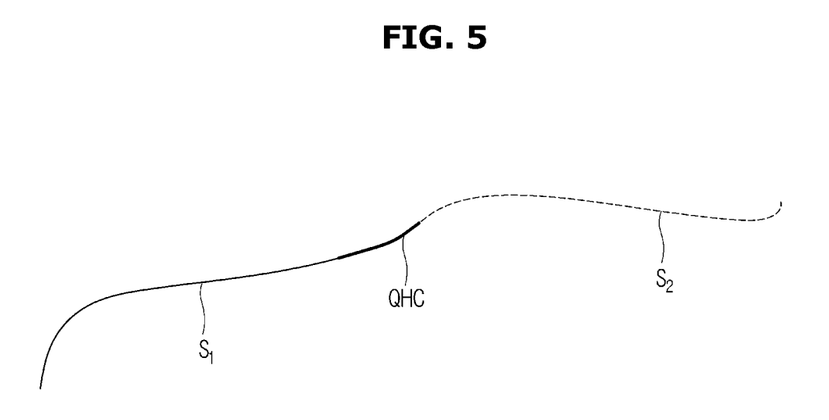

The GPS data obtained through the GPS device 11 is formed of point data defined by an x-coordinate and a y-coordinate as shown in FIG. 4. The processor 317 models GPS points in a curve to generate a precise map as shown in FIG. 4.

As shown in FIG. 4, errors may occur between the modeled curve and the GPS points, and the errors may become greater as a length of the curve becomes longer. Therefore, the disclosed embodiments provide a method of modeling GPS points as a plurality of segments, and a method of calculating a number of GPS points which form the segments to enable errors between each of the segments and the GPS points forming the corresponding segments to be within an allowable error range. In addition, the disclosed embodiments provide a method of modeling GPS data by connecting adjacent segments among the plurality of segments to guarantee continuity between the adjacent segments. For the purpose of the present disclosure, the "amount of GPS data," as claimed, may refer to a number of GPS points, as explained herein. The terms "number" and "amount" may be used interchangeably herein.

First, the method of modeling the GPS data as curved segments will be described, and the method of calculating the amount of GPS points which form the segments to enable the errors between each of the segments and the GPS points forming the corresponding segments to be within the allowable error range will be described afterwards.

The disclosed embodiments perform segment modeling for $N_s$ GPS points. A set of the GPS points which become modeling targets is as Equation 1 below.

$$P = \{(x_0, y_0), (x_1, y_1), \ldots, (x_l, y_l)\} \qquad \text{<Equation 1>}$$

The disclosed embodiments model each of the x-coordinate and the y-coordinate by a quintic equation with respect to s which indicates a length of the segments. Equation 2 below is the x-coordinate modeled by the quintic equation of s, and Equation 3 is the y-coordinate modeled by the quintic equation of s. Although the disclosed embodiments have modeled the x and y coordinate values by the quintic equation as expressed by Equation 2 and Equation 3 below, embodiments are not limited thereto, and the x and y coordinate values may be modeled by an equation of a degree equal to or greater than five or a degree equal to or less than five.

$$x = f(s) = a_5 s^5 + a_4 s^4 + a_3 s^3 + a_2 s^2 + a_1 s^1 + a_0 \quad \text{<Equation 2>}$$

$$y = g(s) = b_5 s^5 + b_4 s^4 + b_3 s^3 + b_2 s^2 + b_1 s^1 + b_0 \quad \text{<Equation 3>}$$

To enable functions which have modeled x-coordinates and y-coordinates of the $N_s$ GPS points to satisfy a least square method, the disclosed embodiments calculate coefficients of the functions. To obtain the coefficients of the functions which satisfy the least square method, the functions of Equation 2 and Equation 3 are expressed in a matrix equation form in Equation 4 and Equation 5 below, and an a vector and a b vector are calculated.

$$Sa = x \Rightarrow \begin{bmatrix} s_0^5 & s_0^4 & \cdots & 1 \\ s_1^5 & s_1^4 & \cdots & 1 \\ \vdots & \vdots & \ddots & \vdots \\ s_l^5 & s_l^5 & \cdots & 1 \end{bmatrix} \begin{bmatrix} a_5 \\ a_4 \\ a_3 \\ a_2 \\ a_1 \\ a_0 \end{bmatrix} = \begin{bmatrix} x_0 \\ x_1 \\ \vdots \\ x_l \end{bmatrix} \quad \text{<Equation 4>}$$

$$Sb = y \Rightarrow \begin{bmatrix} s_0^5 & s_0^4 & \cdots & 1 \\ s_1^5 & s_1^4 & \cdots & 1 \\ \vdots & \vdots & \ddots & \vdots \\ s_l^5 & s_l^5 & \cdots & 1 \end{bmatrix} \begin{bmatrix} b_5 \\ b_4 \\ b_3 \\ b_2 \\ b_1 \\ b_0 \end{bmatrix} - \begin{bmatrix} y_0 \\ y_1 \\ \vdots \\ y_l \end{bmatrix} \quad \text{<Equation 5>}$$

When coefficients of Equation 2 and Equation 3 above, i.e. the a vector and the b vector in Equation 4 and Equation 5 above, are obtained, the segments may be modeled to satisfy the least square method. First, an s-matrix is calculated to obtain the a vector and the b vector. Generally, when it is assumed that the GPS device 11 operates under a frequency of 100 Hz, a GPS point may be obtained every 10 ms. Consequently, when a vehicle obtains GPS data while traveling at a velocity of 60 km/h(16.7 m/s), intervals between GPS points become 17 cm. Consequently, s which indicates the length of the segments may be approximated as a straight line. Equation 6 below represents s approximated as the straight line.

$$s_j = \sum_{i=0}^{i-1} |\overline{p}_i - \overline{p}_{i+1}| = \sum_{i=0}^{j-1} \sqrt{(x_i - x_{i+1})^2 + (y_i - y_{i+1})^2}, \quad \text{<Equation 6>}$$
$$0 \leq j \leq N_s$$

When the segments are modeled to satisfy the least square method as mentioned above, a case in which an end point and a start point of consecutive segments among the plurality of segments do not correspond to each other may occur. Therefore, the disclosed embodiments add conditions below to make the end point and the start point of the consecutive segments correspond to each other and make differential values of the end point and the start point correspond to each other.

$$\begin{aligned} f(0) &= x_0 = a_0 \\ f(L) &= x_l = a_5 L^5 + a_4 L^4 + a_3 L^3 + a_2 L^2 + a_1 L^1 + x_0 \\ g(0) &= y_0 b_0 \\ g(L) &= y_l = a_5 L^5 + a_4 L^4 + a_3 L^3 + a_2 L^2 + a_1 L^1 + y_0 \end{aligned} \quad \text{<Equation 7>}$$

$$\frac{dy}{dx} \approx \frac{g'(0)}{f'(0)} = h_0 g'(0) = \alpha h_0, \, f'(0) = \alpha \quad \text{<Equation 8>}$$
$$\frac{dy}{dx} \approx \frac{g'(L)}{f'(L)} = h_l g'(L) = \beta h_l, \, f'(L) = \beta$$

In other words, making the end point and the start point of the consecutive segments correspond to each other, makes each of the start points and the end points of each of the segments correspond to the GPS points which were the modeling targets as expressed by Equation 7. In addition, by making the end point of the n (a natural number equal to or greater than 1)$^{th}$ segment correspond to the start point of the (n+1)$^{th}$ segment using Equation 8, a first derivative continuity of a point at which the end point and the start point of the segments correspond to each other may be guaranteed.

When the conditions expressed by Equation 7 and Equation 8 are applied to Equation 2 and Equation 3, and Equation 2 and Equation 3 are simplified as Equation 9 and Equation 10, the coefficients $a_0$ to $a_5$ in Equation 2 and the coefficients $b_0$ to $b_5$ in Equation 3, i.e. twelve unknowns, may be simplified with six unknowns, $\alpha$, $\beta$, $a_4$, $a_5$, $b_4$, and $b_5$.

$$\begin{aligned} a_0 &= x_0 \\ a_1 &= \alpha \\ a_2 &= \frac{3}{L^2}(x_l - x_0) - \frac{1}{L}(2\alpha | \beta) | a_4 L^2 | 2a_5 L^3 \\ a_3 &= -\frac{2}{L^3}(x_l - x_0) + \frac{1}{L^2}(\alpha + \beta) - 2a_4 L - 3a_5 L^2 \end{aligned} \quad \text{<Equation 9>}$$

$$\begin{aligned} b_0 &= y_0 \\ b_1 &= \alpha h_0 \\ b_2 &= \frac{3}{L^2}(y_l - y_0) - \frac{1}{L}(2\alpha h_0 + \beta h_l) - b_4 L^2 - 2b_5 L^3 \\ b_3 &= \frac{2}{L^3}(y_l - y_0) | \frac{1}{L^2}(\alpha h_0 | \beta h_l) \; 2b_4 L \; 3b_5 L^2 \end{aligned} \quad \text{<Equation 10>}$$

When Equation 2 and Equation 3 are simplified in a matrix equation form with respect to the six unknowns, they are shown below as Equation 11 and Equation 12.

$$\begin{bmatrix} \frac{s_1^3}{L^2} - \frac{2s_1^2}{L} + s_1 & \frac{s_1^3}{L^2} - \frac{s_1^2}{L} & s_1^4 - 2Ls_1^3 + L^2s_1^2 & s_1^5 - 3L^2s_1^2 + 2L^2s_1^2 \\ \frac{s_2^3}{L^2} - \frac{2s_2^3}{L} + s_2 & \frac{s_2^3}{L^2} - \frac{s_2^2}{L} & s_2^4 - 2Ls_2^3 + L^2s_1^2 & s_2^5 - 3L^2s_2^2 + 2L^2s_2^2 \\ \vdots & \vdots & \vdots & \vdots \\ \frac{s_{l-1}^3}{L^2} - \frac{2s_{l-1}^2}{L} + s_{l-1} & \frac{s_{l-1}^3}{L^2} - \frac{s_{l-1}^2}{L} & s_{l-3}^4 - 2Ls_{l-1}^3 + L^2s_{l-1}^2 & s_{l-1}^5 - 3L^2s_{l-1}^2 + 2L^2s_{l-1}^2 \end{bmatrix} \cdot$$

<Equation 11>

$$\begin{bmatrix} \alpha \\ \beta \\ \alpha_4 \\ \alpha_5 \end{bmatrix} = \begin{bmatrix} x_1 - \left[ x_0 + \frac{3s_1^2}{L^2}(x_l - x_0) - \frac{2s_1^3}{L^3}(x_l - x_0) \right] \\ x_2 - \left[ x_0 + \frac{3s_2^2}{L^2}(x_l - x_0) - \frac{2s_2^3}{L^3}(x_l - x_0) \right] \\ \vdots \\ x_{l-1} - \left[ x_0 + \frac{3s_{l-1}^2}{L^2}(x_l - x_0) - \frac{2s_{l-1}^3}{L^2}(x_l - x_0) \right] \end{bmatrix}$$

$$\begin{bmatrix} h_0\left(\frac{s_1^3}{L^2} - \frac{2s_1^2}{L} + s_1\right) & h_l\left(\frac{s_1^3}{L^2} - \frac{s_1^2}{L}\right) & s_1^4 - 2Ls_1^3 + L^2s_1^2 & s_1^5 - 3L^2s_1^5 + 2L^2s_1^2 \\ h_0\left(\frac{s_2^2}{L^2} - \frac{2s_2^3}{L} + s_2\right) & h_l\left(\frac{s_2^3}{L^2} - \frac{s_2^2}{L}\right) & s_2^4 - 2Ls_2^3 + L^2s_1^2 & s_2^5 - 3L^2s_2^3 + 2L^2s_2^2 \\ \vdots & \vdots & \vdots & \vdots \\ h_0\left(\frac{s_{l-1}^3}{L^2} - \frac{2s_{l-1}^2}{L} + s_{l-1}\right) & h_l\left(\frac{s_{l-1}^3}{L^2} - \frac{s_{l-1}^2}{L}\right) & s_{l-3}^4 - 2Ls_{l-1}^2 + L^2s_{l-1}^2 & s_{l-1}^5 - 3L^2s_{l-1}^3 + 2L^3s_{l-1}^2 \end{bmatrix} \cdot$$

<Equation 12>

$$\begin{bmatrix} \alpha \\ \beta \\ b_4 \\ b_5 \end{bmatrix} = \begin{bmatrix} y_1 - \left[ y_0 + \frac{3s_1^2}{L^2}(y_l - y_0) - \frac{2s_1^3}{L^3}(y_l - y_0) \right] \\ y_2 - \left[ y_0 + \frac{3s_2^2}{L^2}(y_l - y_0) - \frac{2s_2^3}{L^3}(y_l - y_0) \right] \\ \vdots \\ y_{l-1} - \left[ y_0 + \frac{3s_{l-1}^2}{L^2}(y_l - y_0) - \frac{2s_{l-1}^3}{L^3}(y_l - y_0) \right] \end{bmatrix}$$

When Equation 11 and Equation 12 are simplified as one equation, it is shown below as Equation 13.

$$\begin{bmatrix} \frac{s_1^3}{L^2} - \frac{2s_1^2}{L} + s_1 & \frac{s_1^3}{L^2} - \frac{s_1^2}{L} & s_1^4 - 2Ls_1^3 + L^2s_1^2 & s_1^5 - 3L^2s_1^5 + 2L^2s_1^2 & 0 & 0 \\ \frac{s_2^2}{L^2} - \frac{2s_2^3}{L} + s_2 & \frac{s_2^3}{L^2} - \frac{s_2^2}{L} & s_2^4 - 2Ls_2^3 + L^2s_1^2 & s_2^5 - 3L^2s_2^3 + 2L^2s_2^2 & 0 & 0 \\ \vdots & \vdots & \vdots & \vdots & \vdots & \vdots \\ \frac{s_{l-1}^3}{L^2} - \frac{2s_{l-1}^2}{L} + s_{l-1} & \frac{s_{l-1}^3}{L^2} - \frac{s_{l-1}^2}{L} & s_{l-1}^4 - 2Ls_{l-1}^3 + L^2s_{l-1}^2 & s_{l-1}^5 - 2L^2s_{l-1}^2 & 0 & 0 \\ h_0\left(\frac{s_1^3}{L^2} - \frac{2s_1^2}{L} + s_1\right) & h_l\left(\frac{s_1^3}{L^2} - \frac{s_1^2}{L}\right) & 0 & 0 & s_1^4 - 2Ls_1^3 + L^2s_1^2 & s_1^5 - 3L^2s_1^5 + 2L^2s_1^2 \\ h_0\left(\frac{s_2^2}{L^2} - \frac{2s_2^3}{L} + s_2\right) & h_l\left(\frac{s_2^3}{L^2} - \frac{s_2^2}{L}\right) & 0 & 0 & s_2^4 - 2Ls_2^3 + L^2s_1^2 & s_2^5 - 3L^2s_2^3 + 2L^2s_2^2 \\ \vdots & \vdots & \vdots & \vdots & \vdots & \vdots \\ h_0\left(\frac{s_{l-1}^3}{L^2} - \frac{2s_{l-1}^2}{L} + s_{l-1}\right) & h_l\left(\frac{s_{l-1}^3}{L^2} - \frac{s_{l-1}^2}{L}\right) & 0 & 0 & s_{l-1}^4 - 2Ls_{l-1}^2 + L^2s_{l-1}^2 & s_{l-1}^5 - 3L^2s_{l-1}^3 + 2L^3s_{l-1}^2 \end{bmatrix}$$

<Equation 13>

$$\begin{bmatrix} \alpha \\ \beta \\ a_4 \\ a_5 \\ b_4 \\ b_5 \end{bmatrix} = \begin{bmatrix} x_1 - \left[x_0 + \frac{3s_1^2}{L^2}(x_l - x_0) - \frac{2s_1^3}{L^3}(x_l - x_0)\right] \\ x_2 - \left[x_0 + \frac{3s_2^2}{L^2}(x_l - x_0) - \frac{2s_2^3}{L^3}(x_l - x_0)\right] \\ \vdots \\ x_{l-1} - \left[x_0 + \frac{3s_{l-1}^2}{L^2}(x_l - x_0) - \frac{2s_{l-1}^3}{L^2}(x_l - x_0)\right] \\ y_1 - \left[y_0 + \frac{3s_1^2}{L^2}(y_l - y_0) - \frac{2s_1^3}{L^3}(y_l - y_0)\right] \\ y_2 - \left[y_0 + \frac{3s_2^2}{L^2}(y_l - y_0) - \frac{2s_2^3}{L^3}(y_l - y_0)\right] \\ \vdots \\ y_{l-1} - \left[y_0 + \frac{3s_{l-1}^2}{L^2}(y_l - y_0) - \frac{2s_{l-1}^3}{L^3}(y_l - y_0)\right] \end{bmatrix}$$

Matrix A of Equation 13 may be decomposed as Equation 14 using singular value decomposition, and when a vector x which satisfies the least square method is obtained, it may be expressed by Equation 15 below.

$$A = U \cdot S \cdot V^T \qquad \text{<Equation 14>}$$

$$x = \sum_{i=1}^{r} [\sigma_i^{-1} \cdot (u_i^T \cdot b) \cdot v_i] \qquad \text{<Equation 15>}$$

In Equation 14, U is an orthogonal matrix obtained by decomposing $AA^T$ using eigenvalue decomposition, V is an orthogonal matrix obtained by decomposing $A^TA$ using the eigenvalue decomposition, and S is a rectangular diagonal matrix having square roots of eigenvalues of A as diagonal elements, wherein the diagonal elements are singular values of A.

In Equation 15, σ is a singular value of A which is a diagonal element of a matrix S, u is an element of a matrix U, and v is an element of a matrix V. In addition, r represents a number of singular values.

The vector x may be obtained by the process mentioned above, and the coefficients of Equation 2 and Equation 3 may be calculated by Equation 9 and Equation 10 to perform the segment modeling. Additionally, as shown in FIG. 5, a Hermite curve, e.g. a quintic Hermite curve, may be inserted at a portion at which an end point and a start point of consecutive segments $S_1$ and $S_2$ correspond to each other, thereby curvature continuity, i.e. second derivative continuity, may be guaranteed.

Meanwhile, errors may occur between segments obtained by the process mentioned above and GPS points forming the corresponding segments. Generally, the errors become greater as the length of the segments becomes longer, i.e., as the number of GPS points forming the segments increases. The disclosed embodiments provide the method of calculating the number of GPS points which form the segments to enable the errors between each of the segments and the GPS points forming the corresponding segments to be within the allowable error range. Hereinafter, the method will be described in detail.

When the processor 317 has received GPS data from the GPS device 11, the processor 317 models $N_s$ GPS points as segments by the method mentioned above. The disclosed embodiments pre-store a number of GPS points required for the processor 317 to perform segment modeling for the first time as $N_u$. For example, when $N_u$ is preset as 600, the number, $N_s$, of the GPS points required for the processor 317 to perform the segment modeling starts from $N_u$, i.e. 600.

The processor 317 models the $N_s$ GPS points by the method mentioned above to generate segments and determines whether errors, i.e., transverse errors, between the generated segments and the GPS points forming the corresponding segments are within a predetermined allowable error range.

When the errors between the segments and the GPS points forming the corresponding segments are within the allowable error range, the processor 317 increases the number of GPS points which become targets of the segment modeling by $N_u$ and performs the segment modeling again. For example, the processor 317 performs the segment modeling for $N_s+N_u$ GPS points. When the errors between the segments and the GPS points are within the allowable error range, modeling is performed while gradually increasing the number of GPS points which become targets of the segment modeling to increase the length of the segments. Even though the errors become generally greater as the length of the segments increases, the errors do not always become greater due to the increase in the length of the segments since the disclosed embodiments determine whether the errors between the segments and the GPS points are within the allowable error range, and, in accordance with the result, determines whether to perform modeling after increasing the number of GPS points or decreasing the number of GPS points.

When the errors between the segments and the GPS points deviate from the allowable error range, the processor 317 decreases the number of GPS points which become the targets of the segment modeling, and performs modeling again for the decreased number of GPS points. For example, the segment modeling is performed for a number of GPS points which results from subtracting $N_u/2$ from $N_s$, i.e., $N_s-N_u/2$ GPS points. Although the disclosed embodiments have decreased the number of GPS points by a number which results from dividing $N_u$ by 2, the decreased number or percentage is not limited thereto and may be predetermined as various numbers.

The disclosed embodiments perform modeling again after increasing the number of GPS points when the errors between the segments and the GPS points are within the allowable error range, and performs modeling again after decreasing the number of GPS points when the errors deviate from the allowable error range. While repeating this process, the disclosed embodiments determine an optimal number of GPS points which form the segments within a limit that does not deviate from the allowable error range.

The processor 317 determines whether errors between the remodeled segments and the GPS points deviate from the allowable error range, performs modeling again after increasing the number of GPS points when the errors are within the allowable error range, and performs modeling after decreasing the number of GPS points again when the errors deviate from the allowable error range.

The disclosed embodiments pre-store a minimum number of GPS points such that, when the number of GPS points reaches the minimum number, error determination is not performed anymore and corresponding segments are stored to determine road shape information. The disclosed embodiments may store the minimum number of GPS points as mentioned above, or pre-store a minimum value of a decreased number or decreased percentage of the GPS points and when the decreased number or decreased percentage of the GPS points reaches the minimum value, additional error determination is not performed.

When the segments are determined, the processor 317 uses the determined segments to generate and update road shape information. The road shape information generated in this way may be included in a precise map and stored in the memory 315. The processor 317 may display the precise map formed based on the segments generated through the modeling process mentioned above on the display 300.

Figure 6:
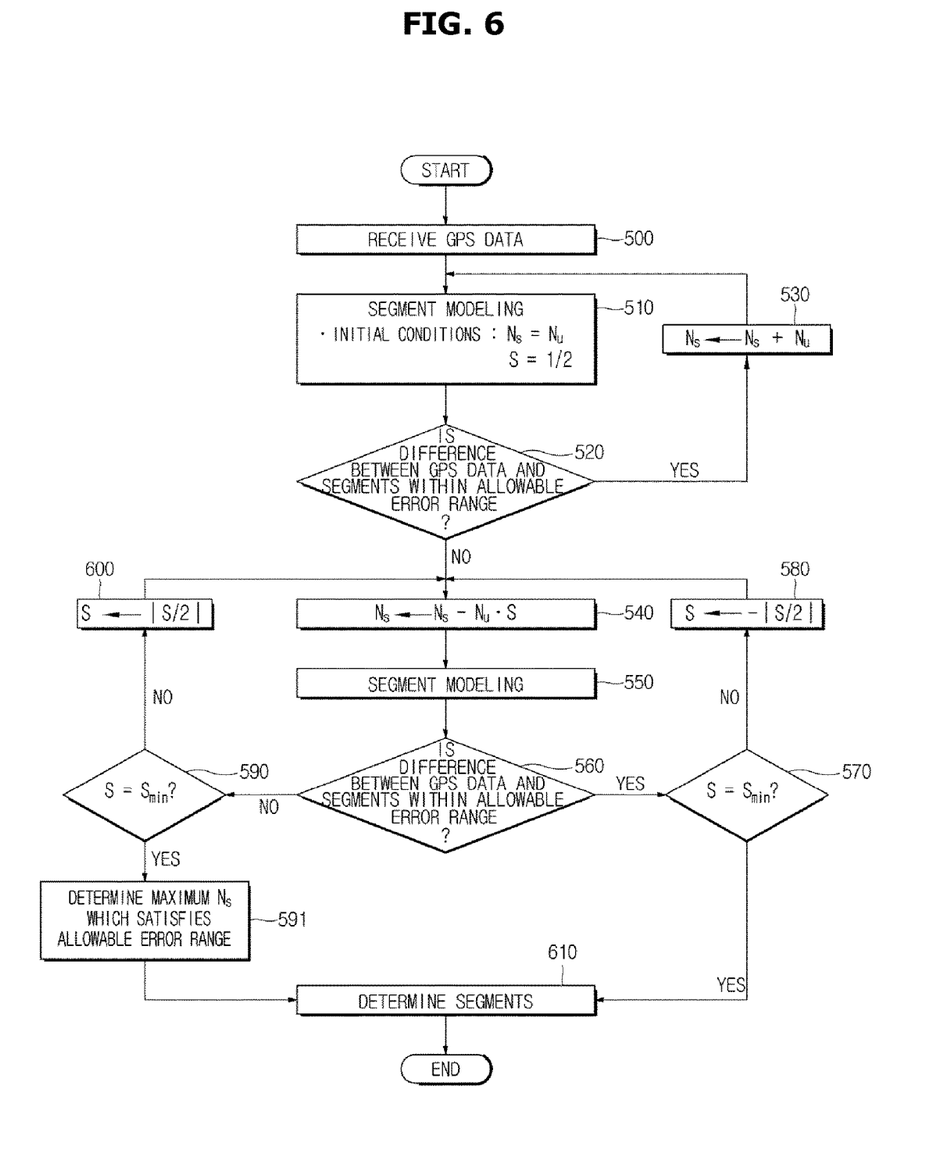
FIG. 6 is a flow chart illustrating another map generating method according to embodiments.

FIG. 6 is a flow chart illustrating another map generating method according to embodiments. The method of determining the number of GPS points which form the segments will be described in more detail with reference to FIG. 6.

As shown in FIG. 6, the processor 317 models segments (S510) after receiving GPS information (S500). As initial conditions for segment modeling, the number of GPS points which become modeling targets, i.e. Ns, is equal to the number of GPS points required for the processor 317 to perform the segment modeling for the first time, i.e. Nu, and S, which is a percentage related to the decrease in number of GPS points, is ½. The initial conditions are only illustrative, and may also be pre-stored as values.

After the processor 317 receives GPS data from the GPS device 11, the processor 317 models $N_s$ GPS points as segments by the method mentioned above. For example, when $N_u$ is preset as 600, the number, $N_s$, of the GPS points required for the processor 317 to perform the segments modeling starts from $N_u$, i.e. 600.

The processor 317 determines whether errors between the GPS data and the segments are within an allowable error range (S520), and when the errors between the GPS data and the segments are within the allowable error range, increases the number of GPS points to $N_s+N_u$ (S530) and performs modeling again (S510).

The processor 317 models the $N_s$ GPS points by the method mentioned above to generate the segments, and determines whether the errors, i.e. transverse errors, between the generated segments and the GPS points forming the corresponding segments are within a predetermined allowable error range.

When the errors between the segments and the GPS points forming the corresponding segments are within the allowable error range, the processor 317 increases the number of GPS points which become targets of the segment modeling by $N_u$ and performs the segment modeling again. For example, the processor 317 performs the segment modeling for $N_s+N_u$ GPS points. When the errors between the segments and the GPS points are within the allowable error range, modeling is performed while gradually increasing the number of GPS points which become targets of the segment modeling to increase the length of the segments. Even though the errors become generally greater as the length of the segments increases, the errors do not always become greater due to the increase in the length of the segments since the disclosed embodiments determine whether the errors between the segments and the GPS points are within the allowable error range, and, in accordance with the result, determines whether to perform modeling after increasing the number of GPS points or decreasing the number of GPS points.

When the errors between the GPS data and the segments deviate from the allowable error range, the processor 317 decreases the number of GPS points to $N_s-N_u S$ (S540), and performs modeling again (S550).

When the errors between the segments and the GPS points deviate from the allowable error range, the processor 317 decreases the number of GPS points which become the targets of the segments modeling, and performs modeling again for the decreased number of GPS points. For example, the segment modeling is performed for a number of GPS points which results from subtracting $N_u/2$ from $N_s$, i.e., $N_s-N_u S$ (S is ½ in the initial conditions) GPS points. Although the disclosed embodiments have decreased the number of GPS points by a number which results from dividing $N_u$ by 2, the decreased number or percentage is not limited thereto and may be predetermined as various numbers.

The processor 317 determines whether the errors between the GPS data and the segments are within the allowable error range (S560), and when the error between the GPS data and the segments are within the allowable error range, determines whether a decreased percentage S corresponds to a predetermined minimum value (S570). When the decreased percentage S corresponds to the predetermined minimum value, the processor 317 determines segments (S610), and when the decreased percentage S does not corresponds to the predetermined minimum value, the processor 317 returns to S540 while having −S/2 as the decreased percentage S (S580). When the errors between the GPS data and the segments deviate from the allowable error range, the processor 317 determines whether the decreased percentage S corresponds to the predetermined minimum value (S590). When the decreased percentage S corresponds to the predetermined minimum value, the processor 317 determines the maximum $N_s$ which satisfies the allowable error range (S591), and determines segments which are modeled with the maximum $N_s$ GPS points (S610). When the decreased percentage S does not correspond to the minimum value, the processor 317 returns to S540 while having S/2 as the decreased percentage S (S600).

The processor 317 determines whether the errors between the remodeled segments and the GPS points deviate from the allowable error range, increases the number of GPS points and performs modeling again when the errors are within the allowable error range, and decreases the number of GPS points again and performs modeling when the errors deviate from the allowable error range.

The disclosed embodiments may pre-store a minimum value of the decreased percentage and not perform additional error determination when the decreased percentage reaches the minimum value. Or, the disclosed embodiments may pre-store a minimum number of GPS points, such that error determination is not performed when the number of GPS points reaches the minimum number and the corresponding segments are stored to determine road shape information. Or, the disclosed embodiments may pre-store a minimum value of a number of decreasing the GPS points and not perform additional error determination when the number of decreasing the GPS points reaches the minimum value.

When the errors between the remodeled segments and the GPS points are within the allowable error range and the decreased percentage does not correspond to the minimum value, the processor 317 enables the number of the GPS points which become modeling targets, i.e. $N_s$, while having −S/2 as S to be increased to $N_s+N_u/4$.

When the errors between the remodeled segments and the GPS points deviate from the allowable error range and the decreased percentage does not correspond to the minimum value, the processor 317 enables the number of the GPS points which become modeling targets, i.e. $N_s$, while having S/2 as S to be decreased to $N_s-N_u/4$. When the errors between the remodeled segments and the GPS points deviate from the allowable error range and the decreased percentage corresponds to the minimum value, the processor 317 determines and stores the maximum value of $N_s$ which satisfies the allowable error range. The processor 317 may store the segments modeled with the determined $N_s$ GPS points to determine road shape information.

The disclosed embodiments perform modeling again after increasing the number of GPS points when the errors between the segments and the GPS points are within the allowable error range, and performs modeling again after decreasing the number of GPS points when the errors deviate from the allowable error range. While repeating this process, the disclosed embodiments determine the optimal number of GPS points which form the segments within a limit that does not deviate from the allowable error range.

According to disclosed embodiments, a vehicle and a map generating method for the vehicle can provide a precise map with a minimized sense of difference from GPS data. In addition, storing map information and constructing a database can be more easily performed.

Although certain embodiments of the present disclosure have been shown and described, it would be appreciated by those skilled in the art that changes may be made in these embodiments without departing from the principles and spirit of the present disclosure, the scope of which is defined in the claims and their equivalents.

What is claimed is:
1. A map generating method comprising:
   modeling, by a processor, a predetermined amount of global positioning system (GPS) data as linear segments;
   determining, by the processor, whether a difference between the modeled segments and the GPS data is within a predetermined range;
   calculating, by the processor, a number of GPS points forming the modeled segments based on whether the difference is within the predetermined range;
   determining whether an end point of an $n^{th}$ segment of the modeled segments and a start point of an $(n+1)^{th}$ segment of the modeled segments correspond to each other; and
   adjusting the modeled segments to make the end point of the $n^{th}$ segment correspond to the start point of the $(n+1)^{th}$ segment when the end point of the $n^{th}$ segment and the start point of the $(n+1)^{th}$ segment do not correspond to each other, wherein
   n is a natural number equal to or greater than 1, and the adjusting of the modeled segments to make the end point of the $n^{th}$ segment correspond to the start point of the $(n+i)^{th}$ segment comprises:
    making the start point and the end point of the modeled segments correspond to respectively corresponding GPS data, and
    making differential values of the end point of the $n^{th}$ segment and the start point of the $(n+1)^{th}$ segment correspond to each other.

2. The map generating method according to claim 1, wherein the calculating of the number of GPS points forming the modeled segments further comprises:
    decreasing the number of GPS points by a predetermined percentage when the difference deviates from the predetermined range.

3. The map generating method according to claim 2, further comprising:
    remodeling the decreased number of GPS points as linear segments;
    determining whether the decreased number of GPS points corresponds to a predetermined amount when a difference between the remodeled segments and the decreased number of GPS points deviates from the predetermined range; and
    storing the remodeled segments when the decreased number of GPS points corresponds to the predetermined amount.

4. The map generating method according to claim 3, further comprising:
    decreasing further the decreased number of GPS points by the predetermined percentage when the decreased number of GPS points does not correspond to the predetermined amount.

5. The map generating method according to claim 3, further comprising:
    storing the remodeled segments when the difference between the remodeled segments and the decreased number of GPS points is within the predetermined range;
    increasing the decreased number of GPS points by a predetermined percentage; and
    remodeling the increased number of GPS points as linear segments.

6. The map generating method according to claim 1, wherein the calculating of the number of GPS points forming the modeled segments further comprises:
    increasing the number of GPS points by a predetermined percentage when the difference is within the predetermined range.

7. The map generating method according to claim 6, further comprising:
    remodeling the increased number of GPS points as linear segments;
    increasing further the increased number of GPS points by the predetermined percentage when the difference between the remodeled segments and the increased number of GPS points is within the predetermined range; and
    modeling again the further increased number of GPS points as linear segments.

8. The map generating method according to claim 7, further comprising:
    determining whether the increased number of GPS points corresponds to the predetermined amount when the difference between the remodeled segments and the increased number of GPS points deviates from the predetermined range; and
    decreasing the increased number of GPS points by the predetermined percentage when the increased number of GPS points does not correspond to the predetermined amount.

9. The map generating method according to claim 8, further comprising:
    storing the remodeled segments when the increased number of GPS points corresponds to the predetermined amount.

10. The map generating method according to claim 1, further comprising:
    inserting a Hermite curve at a corresponding point of the start point and the end point of the segments.

11. A vehicle comprising:
    a GPS device configured to generate GPS data; and
    a processor configured to receive the GPS data from the GPS device, model a predetermined amount of GPS data as linear segments, calculate a number of GPS points forming the modeled segments based on whether a difference between the modeled segments and the GPS data is within a predetermined range, determine whether an end point of an $n^{th}$ segment of the modeled segments and a start point of an $(n+1)^{th}$ segment of the modeled segments correspond to each other, and adjust the modeled segments to make the end point of the $n^{th}$ segment correspond to the start point of the $(n+1)^{th}$ segment when the end point of the $n^{th}$ segment and the start point of the $(n+1)^{th}$ segment do not correspond to each other, wherein
    n is a natural number equal to or greater than 1, and
    the processor is further configured to:
        make the start point and the end point of the modeled segments correspond to respectively corresponding GPS data, and
        make differential values of the end point of the $n^{th}$ segment and the start point of the $(n+1)^{th}$ segment correspond to each other.

12. The vehicle according to claim 11, wherein the processor is further configured to decrease the number of GPS points by a predetermined percentage when the difference deviates from the predetermined range.

13. The vehicle according to claim 12, wherein the processor is further configured to remodel the decreased number of GPS points as linear segments, determine whether the decreased number of GPS points corresponds to a predetermined amount when a difference between the remodeled segments and the decreased number of GPS points deviates from the predetermined range, and store the remodeled segments when the decreased number of GPS points corresponds to the predetermined amount.

14. The vehicle according to claim 13, wherein the processor is further configured to decrease further the decreased number of GPS points by the predetermined percentage when the decreased number of GPS points does not correspond the predetermined amount.

15. The vehicle according to claim 13, wherein the processor is further configured to store the remodeled segments, increase the decreased number of GPS points by a predetermined percentage, and remodel the increased amount GPS data as linear segments, when the difference between the remodeled segments and the decreased number of GPS points is within the predetermined range.

16. The vehicle according to claim 11, wherein the processor is further configured to increase the number of GPS points by a predetermined percentage when the difference is within the predetermined range.

17. The vehicle according to claim 16, wherein the processor is further configured to remodel the increased amount GPS data as linear segments, increase further the increased number of GPS points by the predetermined percentage when the difference between the remodeled segments and the increased number of GPS points is within the predetermined range, and model again the further increased number of GPS points as linear segments.

18. The vehicle according to claim 17, wherein the processor is further configured to determine whether the increased number of GPS points corresponds to the predetermined amount when the difference between the remodeled segments and the increased number of GPS points deviates from the predetermined range, and decrease the increased number of GPS points by a predetermined percentage when the increased number of GPS points does not correspond to the predetermined amount.

19. The vehicle according to claim 18, wherein the processor is further configured to store the remodeled segments when the increased number of GPS points corresponds to the predetermined amount.

20. The vehicle according to claim 11, wherein the processor is further configured to insert a Hermite curve at a corresponding point of the start point and the end point of the segments.

* * * * *